United States Patent
Miyamoto et al.

(10) Patent No.: US 12,144,068 B2
(45) Date of Patent: Nov. 12, 2024

(54) HEATER HAVING FLEXIBLE PRINTED WIRING BOARD AND METHOD FOR MANUFACTURING SAME

(71) Applicant: NIPPON MEKTRON, LTD., Tokyo (JP)

(72) Inventors: Garo Miyamoto, Tokyo (JP); Shunsuke Aoyama, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 708 days.

(21) Appl. No.: 17/182,351

(22) Filed: Feb. 23, 2021

(65) Prior Publication Data

US 2021/0307118 A1    Sep. 30, 2021

(30) Foreign Application Priority Data

Mar. 26, 2020 (JP) .................................. 2020-056364

(51) Int. Cl.
    *H05B 3/34*      (2006.01)
    *H05K 1/02*      (2006.01)
    *H05K 1/18*      (2006.01)

(52) U.S. Cl.
    CPC .............. *H05B 3/34* (2013.01); *H05K 1/0212* (2013.01); *H05K 1/189* (2013.01);
(Continued)

(58) Field of Classification Search
CPC ........ H05K 1/0212; H05K 1/189; H05K 3/06; H05K 2201/0355; H05K 1/181; H05K 1/167; H05K 1/0393; H05K 2201/09263; H05B 2203/003; H05B 2203/013; H05B 2203/017; H05B 3/34
(Continued)

(56) References Cited

U.S. PATENT DOCUMENTS

| | | | | |
|---|---|---|---|---|
| 6,847,018 B2 * | 1/2005 | Wong | ................ | H05B 3/34 219/505 |
| 2001/0023779 A1 * | 9/2001 | Sugaya | ................ | H05K 1/16 174/255 |

(Continued)

FOREIGN PATENT DOCUMENTS

| | | | | |
|---|---|---|---|---|
| CA | 2736652 A1 | 9/2012 | | |
| CN | 101086970 A | * 12/2007 | ........... | B32B 37/203 |

(Continued)

OTHER PUBLICATIONS

An Office Action; "Notice of Reasons for Refusal," mailed by the Japanese Patent Office on Sep. 5, 2023, which corresponds to Japanese Patent Application No. 2020-056364 and is related to U.S. Appl. No. 17/182,351; with English language translation.
(Continued)

*Primary Examiner* — Eric S Stapleton
(74) *Attorney, Agent, or Firm* — Studebaker & Brackett PC

(57) ABSTRACT

Provided is a heater which includes a flexible printed wiring board, in which the flexible printed wiring board includes a base film, a first metal foil, and a second metal foil, the first metal foil forms a heater circuit portion that generates heat when energized, on a first surface of the base film, and the second metal foil forms a heat conductive foil portion that maintains a non-energized state, on a second surface of the base film.

5 Claims, 8 Drawing Sheets

(52) U.S. Cl.
CPC .. *H05B 2203/013* (2013.01); *H05B 2203/017* (2013.01); *H05K 2201/0355* (2013.01)

(58) Field of Classification Search
USPC .......................................................... 219/528
See application file for complete search history.

(56) References Cited

U.S. PATENT DOCUMENTS

| | | | | |
|---|---|---|---|---|
| 2002/0011348 | A1* | 1/2002 | Takeuchi | H05K 1/0265 |
| | | | | 174/254 |
| 2003/0072129 | A1* | 4/2003 | Kuwako | H05K 1/162 |
| | | | | 361/525 |
| 2003/0082363 | A1* | 5/2003 | Nakagiri | H05K 3/4069 |
| | | | | 428/313.3 |
| 2003/0183620 | A1* | 10/2003 | Wong | H05B 3/34 |
| | | | | 219/549 |
| 2005/0115956 | A1* | 6/2005 | Wong | H05B 3/34 |
| | | | | 219/549 |
| 2005/0186437 | A1* | 8/2005 | Pramanik | H05K 1/162 |
| | | | | 428/480 |
| 2008/0313887 | A1* | 12/2008 | Miyamoto | H05K 1/167 |
| | | | | 29/830 |
| 2011/0297665 | A1* | 12/2011 | Parker | H05B 3/22 |
| | | | | 219/494 |
| 2012/0175362 | A1* | 7/2012 | Mikkelsen | H05B 3/34 |
| | | | | 219/553 |

FOREIGN PATENT DOCUMENTS

| | | | |
|---|---|---|---|
| CN | 209545908 U | 10/2019 | |
| EP | 2068605 A1 * | 6/2009 | .......... H05K 3/0058 |
| JP | S62-249383 A | 10/1987 | |
| JP | H05-064624 U | 8/1993 | |
| JP | 2001-310709 A | 11/2001 | |
| JP | 5038921 B2 | 10/2012 | |
| TW | M447058 U | 2/2013 | |
| TW | M521457 U | 5/2016 | |

OTHER PUBLICATIONS

An Office Action issued by Taiwan Intellectual Property Office on Jul. 31, 2024, which corresponds to Taiwanese Patent Application No. 110106519 and is related to U.S. Appl. No. 17/182,351; with English language translation.

An Office Action mailed by China National Intellectual Property Administration on Sep. 14, 2024, which corresponds to Chinese Patent Application No. 202110090436.4; with English language translation.

* cited by examiner

HEATER HAVING FLEXIBLE PRINTED WIRING BOARD AND METHOD FOR MANUFACTURING SAME

CROSS-REFERENCE TO RELATED APPLICATION

This application is based on Japanese Patent Application No. 2020-056364 filed with the Japan Patent Office on Mar. 26, 2020, the entire content of which is hereby incorporated by reference.

BACKGROUND

1. Technical Field

The present disclosure relates to a heater having a flexible printed wiring board and a method for manufacturing the same.

2. Related Art

Conventionally, a film-like heater has been used to heat a windshield of an automobile, or the like (JP5038921(B2), JPH0564624(U)). In recent years, development of advanced driver assistance systems (ADAS) has progressed. Then, there is an increasing need for the film-like heater to prevent fogging of a camera lens for detection or the windshield. Hereinafter, a general film-like heater and a method for manufacturing the same will be described with reference to FIGS. 7A to 8C. FIGS. 7A to 8C are manufacturing process diagrams of the general film-like heater.

First, a heater wire 510 is formed using a material that generates heat when energized (see FIG. 7A). Examples of materials used for the heater wire 510 include nickel-chromium alloys, SUS, aluminum, platinum, iron, and nickel alloys and pure metals. Next, a first insulating film 521 and a second insulating film 522 are respectively provided on two surfaces of the heater wire 510. The first insulating film 521 and the second insulating film 522 sandwiching the heater wire 510 are bonded by a pressure-sensitive adhesive layer 523 provided between the films (see FIG. 7B). Thereafter, a soaking plate 531 for making distribution of heating temperature uniform is bonded to a surface of the second insulating film 522 by a pressure-sensitive adhesive layer 532 (see FIG. 7C). FIG. 7A is a plan view of the heater wire 510. FIGS. 7B and 7C are schematic cross-sectional views of an intermediate product in a process of manufacturing the heater.

Next, an electronic component 530 is attached to a surface of the first insulating film 521 so as to be electrically connected to the heater wire 510 (see FIG. 8A). An illustrated example shows an insulating film to which only one electronic component 530 is attached. However, a plurality of electronic components may be attached thereto. As an example of the electronic component 530, a thermal fuse can be mentioned. Thereafter, a wire harness 540 is electrically connected to the heater wire 510 by various methods such as a rivet method or soldering (see FIG. 8B). Then, a connector 550 is electrically connected to an end of the wire harness 540 via a crimp pin (not shown). The connector 550 is connected to a power source for energizing the heater wire 510 or an apparatus including a control device for controlling temperature. The heater 500 is obtained by the above manufacturing process. FIGS. 8A and 8B are plan views of the intermediate product in the process of manufacturing the heater. FIG. 8C is a plan view of the heater 500 that is a finished product.

The manufacturing process for obtaining the heater 500 described above requires a step of bonding the soaking plate 531 and a step of attaching the wire harness 540. Therefore, many manufacturing steps are included. The pressure-sensitive adhesive layer 523, the second insulating film 522, and the pressure-sensitive adhesive layer 532 are interposed between the heater wire 510 and the soaking plate 531. Therefore, thermal conductivity is low. Further, there is a possibility that the soaking plate 531 lacks reliability in the degree of bonding to the second insulating film 522.

SUMMARY

A heater according to an embodiment of the present disclosure includes a flexible printed wiring board, in which the flexible printed wiring board includes a base film, a first metal foil, and a second metal foil, the first metal foil forms a heater circuit portion that generates heat when energized, on a first surface of the base film, and the second metal foil forms a heat conductive foil portion that maintains a non-energized state, on a second surface of the base film.

DETAILED DESCRIPTION

Figure 1A:
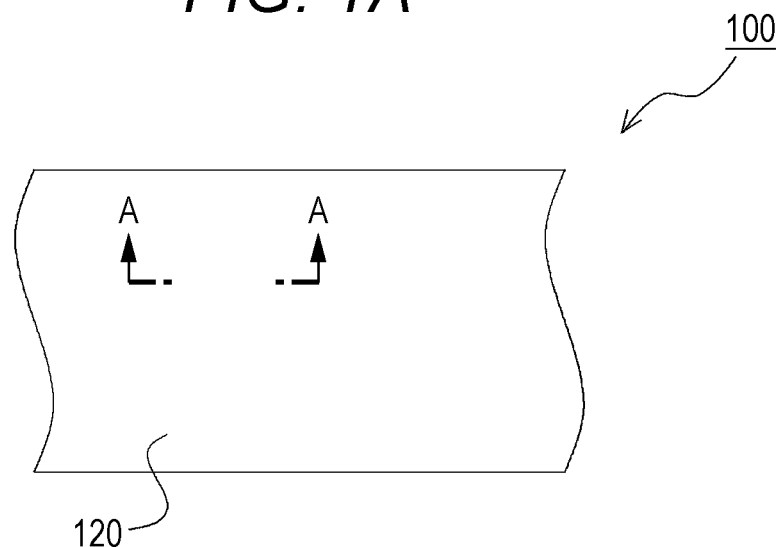
FIGS. 1A and 1B are manufacturing process diagrams of a heater having a flexible printed wiring board according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present disclosure is to provide a heater having a flexible printed wiring board capable of reducing the number of manufacturing steps, and a method for manufacturing the same.

In an embodiment of the present disclosure, the following means are employed to solve the above problems.

That is, a heater according to an embodiment of the present disclosure includes a flexible printed wiring board, in which the flexible printed wiring board includes a base film, a first metal foil, and a second metal foil, the first metal foil forms a heater circuit portion that generates heat when energized, on a first surface of the base film, and the second metal foil forms a heat conductive foil portion that maintains a non-energized state, on a second surface of the base film.

According to the present embodiment, the heat conductive foil portion is formed by the second metal foil. Therefore, a separate step of attaching a member for heat conduction such as a soaking plate is not necessary. Further, only the base film is interposed between the heater circuit portion and the heat conductive foil portion. Therefore, thermal conductivity from the heater circuit portion to the heat conductive foil portion can be increased.

It is preferred that the heat conductive foil portion covers a region of the second surface corresponding to an entire region of the first surface in which the heater circuit portion is provided, the base film being interposed between the heat conductive foil portion and the heater circuit portion.

Further, it is preferred that the heater circuit portion is made of a heater wire that has a constant wire width and meanders, and the heater wire meanders to be disposed at equal intervals.

Moreover, it is preferred that the first metal foil further forms an energizing portion for energizing the heater circuit portion.

This also eliminates a step of attaching a wire harness.

Further, it is preferred that there are provided: a first cover film that covers the first metal foil; a second cover film that covers the second metal foil; at least one electronic component that is disposed on a surface of the first cover film and is electrically connected to the first metal foil; and a connector that is electrically connected to the energizing portion.

A method for manufacturing a heater having a flexible printed wiring board according to the present invention includes an etching step and a laminating step in this order, in which the etching step includes: etching a base film including a first metal foil on a first surface thereof and including a second metal foil on a second surface thereof; forming a heater circuit portion that generates heat when energized, by a part of the first metal foil; and forming a heat conductive foil portion that maintains a non-energized state, by a part of the second metal foil, and the laminating step includes providing a first cover film that covers a surface of the first metal foil and a second cover film that covers a surface of the second metal foil.

According to this embodiment, the heater circuit portion and the heat conductive foil portion are formed by the etching step. Therefore, the number of manufacturing steps can be reduced.

It is preferred that the heat conductive foil portion covers a region of the second surface corresponding to an entire region of the first surface in which the heater circuit portion is provided, the base film being interposed between the heat conductive foil portion and the heater circuit portion.

It is preferred that a part of the first metal foil forms an energizing portion that energizes the heater circuit portion in the etching step.

Thus, the energizing portion is also formed by the etching step. Therefore, the number of manufacturing steps can be further reduced.

It is preferred that a reflow step is further included, and the reflow step includes providing at least one electronic component that is disposed on a surface of the first cover film and is electrically connected to the first metal foil, and a connector that is electrically connected to the energizing portion, by reflow soldering.

Thus, the electronic component and the connector can be attached in the reflow step. Therefore, the number of manufacturing steps can be further reduced.

Note that the above configurations can be used in combination as much as possible.

As described above, according to this embodiment, the number of manufacturing steps can be reduced.

This embodiment will be described in detail by way of example with reference to the drawings below. However, dimensions, materials, shapes, relative arrangements, and the like of components described in this embodiment are not intended to limit the scope of this embodiment to them unless otherwise specified.

(Embodiment)

The heater having the flexible printed wiring board and the method for manufacturing the same according to this embodiment will be described with reference to FIGS. 1A to 5C. FIGS. 1A to 5C are manufacturing process diagrams of the heater having the flexible printed wiring board according to this embodiment. Note that a heater 10 according to this embodiment can be suitably used for heating a camera lens for detection or a windshield. Further, the heater 10 according to this embodiment can be applied not only to heat various members constituting an automobile but also to various devices other than the automobile. The heater 10 according to this embodiment has flexibility. Therefore, the heater 10 can be bent in various directions. Therefore, the heater 10 can be attached even to a curved portion along its curved surface and used.

<Heater>

Figure 5A:
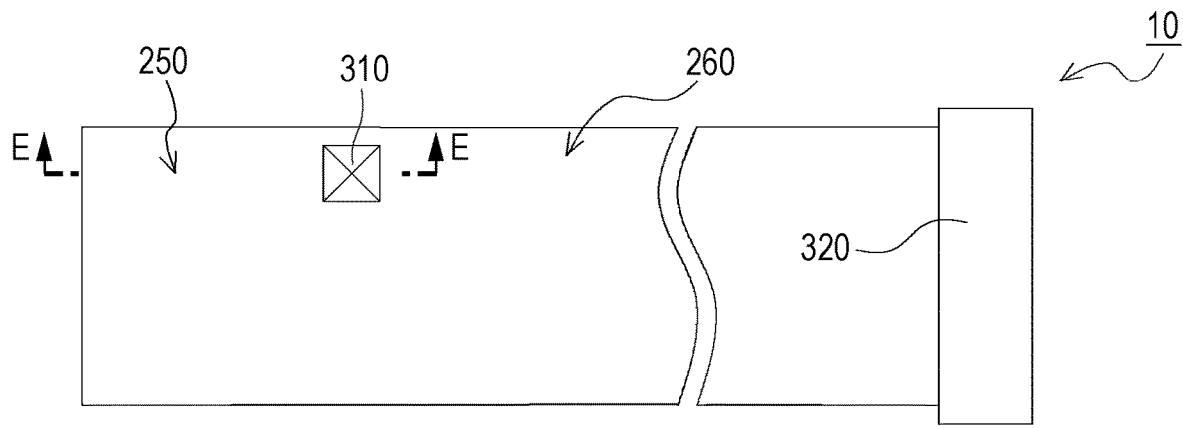
FIGS. 5A to 5C are manufacturing process diagrams of the heater having the flexible printed wiring board according to the embodiment of the present disclosure.
Figure 5B:
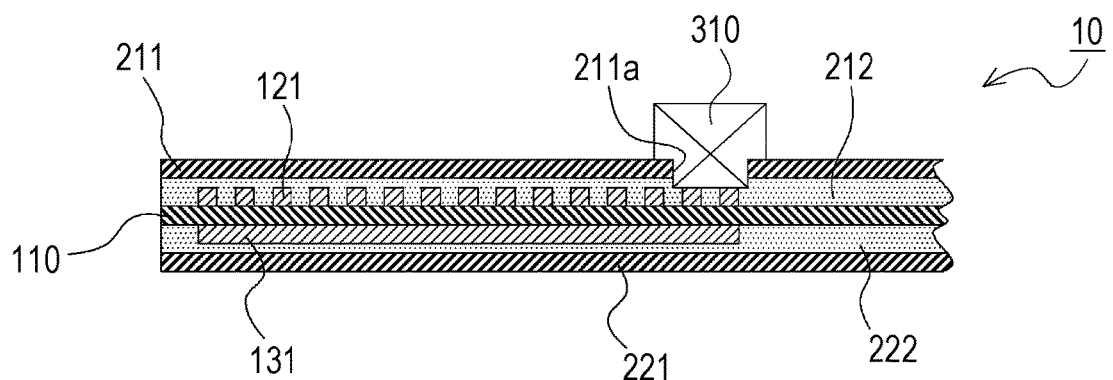
Figure 5C:
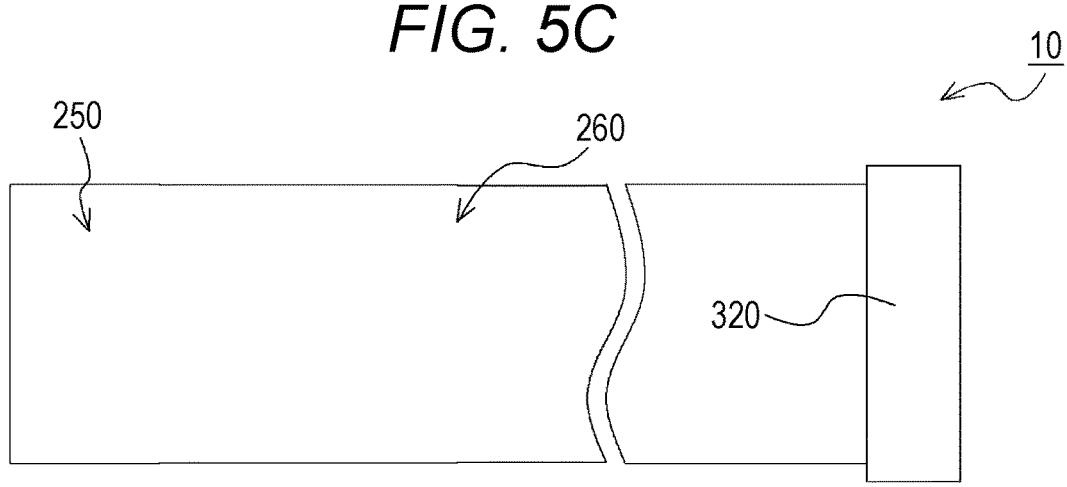

Particularly with reference to FIGS. 5A to 5C, a configuration of the heater having the flexible printed wiring board according to this embodiment will be described. FIGS. 5A to 5C illustrate the heater 10 that is a finished product. Note that FIG. 5A is a plan view of the heater 10. FIG. 5B is a schematic cross-sectional view (corresponding to an EE cross-sectional view in FIG. 5A) of the heater 10. FIG. 5C is a bottom view of the heater 10.

The heater 10 according to this embodiment mainly includes a heating portion 250 for heating a heating target portion, an electric wiring portion 260, an electronic component 310 provided in the heating portion 250, and a connector 320 provided on an end of the electric wiring portion 260. An illustrated example shows only one electronic component 310. However, a plurality of electronic components may be provided depending on an application of the heater 10. Specific examples of the electronic component 310 include a thermistor for temperature control, chip components such as a PTC element, and a thermal fuse. Further, the connector 320 is provided to be connected to a power source for energizing a heater circuit portion 121 or a device (not shown) including a control device for controlling temperature.

Next, internal configurations of the heating portion 250 and the electric wiring portion 260 in the heater 10 will be described. The heater 10 according to this embodiment includes a base film 110, the heater circuit portion 121 and energizing portions 122 and 123 (see FIGS. 2A to 2C) provided on the first surface of the base film 110, and a soaking plate portion 131 as the heat conductive foil portion provided on the second surface of the base film 110. The heater circuit portion 121 is energized through the energizing portions 122 and 123 from a device (not shown) connected to the connector 320. The heater circuit portion 121 is configured to generate heat by this energization. Further, the soaking plate portion 131 is configured so that the non-energized state is maintained. The soaking plate portion 131 is provided to cover a region of the second surface corresponding to the entire region of the first surface in which the heater circuit portion 121 is provided, with the base film 110 interposed therebetween. Thus, the heater circuit portion 121 generates heat and heats the soaking plate portion 131 through the base film 110. Then, the entire region in which the soaking plate portion 131 is provided (corresponding to a region in which the heater circuit portion 121 is provided) is uniformly heated. Note that the above-mentioned heating portion 250 corresponds to a region in which the heater circuit portion 121 and the soaking plate portion 131 are provided. Further, the above-mentioned electric wiring portion 260 corresponds to a region in which the energizing portions 122 and 123 are provided.

Then, the heater 10 also includes a first cover film 211 that covers surfaces of the heater circuit portion 121 and the energizing portions 122 and 123. The first cover film 211 is attached to the base film 110 by a first adhesive layer 212 so as to sandwich the heater circuit portion 121 and the energizing portions 122 and 123. The first cover film 211 is provided with openings 211a and 211b for exposing a part of the heater circuit portion 121 and a part of the energizing portions 122 and 123. Then, the electronic component 310 provided on a surface of the first cover film 211 is electrically connected to the heater circuit portion 121. The electronic component 310 is connected to the heater circuit portion 121 exposed by the opening 211a. Further, the connector 320 described above is also electrically connected to the energizing portions 122 and 123. The connector 320 is also connected to the energizing portions 122 and 123 exposed by the opening 211b.

The heater 10 also includes a second cover film 221 that covers a surface of the soaking plate portion 131. The second cover film 221 is attached to the base film 110 by a second adhesive layer 222 so as to sandwich the soaking plate portion 131.

<Method for Manufacturing Heater Having Flexible Printed Wiring Board>

The method for manufacturing the heater having the flexible printed wiring board will be described in the order of manufacturing steps.

«Material»

Figure 1B:

FIGS. 1A and 1B illustrate a material 100 used for manufacturing the heater 10 according to this embodiment. FIG. 1A is a plan view illustrating a part of the material 100. FIG. 1B is a schematic cross-sectional view (an A-A cross-sectional view in FIG. 1A) of the material 100.

The material 100 is generally called a double-sided copper-clad laminate and is commercially available. The material 100 is configured so that a first metal foil 120 and a second metal foil 130 are respectively provided on two surfaces of the base film 110. The base film 110 is made of a resin material having insulating properties and flexibility (for example, polyimide or polyethylene naphthalate). Further, the first metal foil 120 and the second metal foil 130 are made of copper foil. The material 100 having such a structure has flexibility. Therefore, the material 100 can be bent in various directions.

«Etching Step»

Figure 2A:
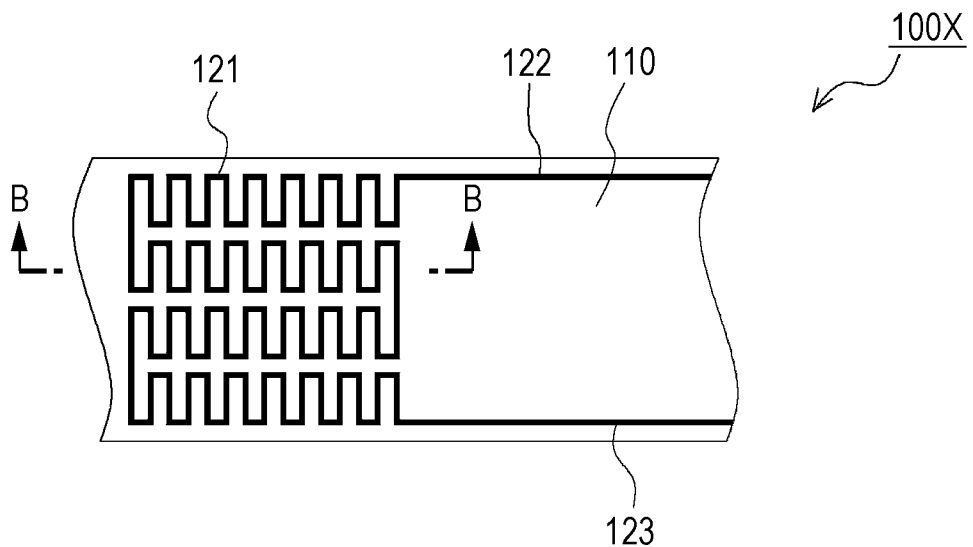
FIGS. 2A to 2C are manufacturing process diagrams of the heater having the flexible printed wiring board according to the embodiment of the present disclosure.
Figure 2B:
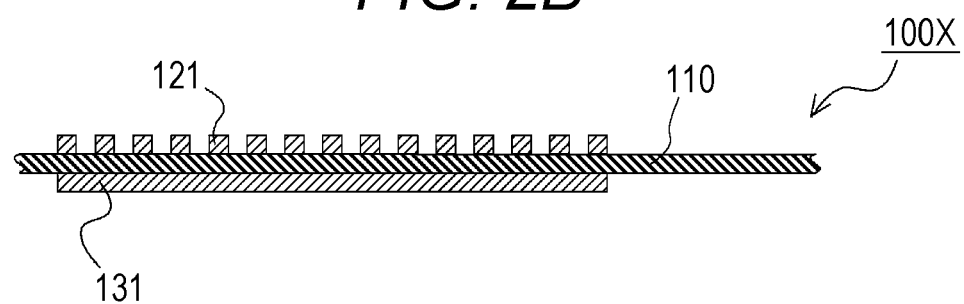
Figure 2C:
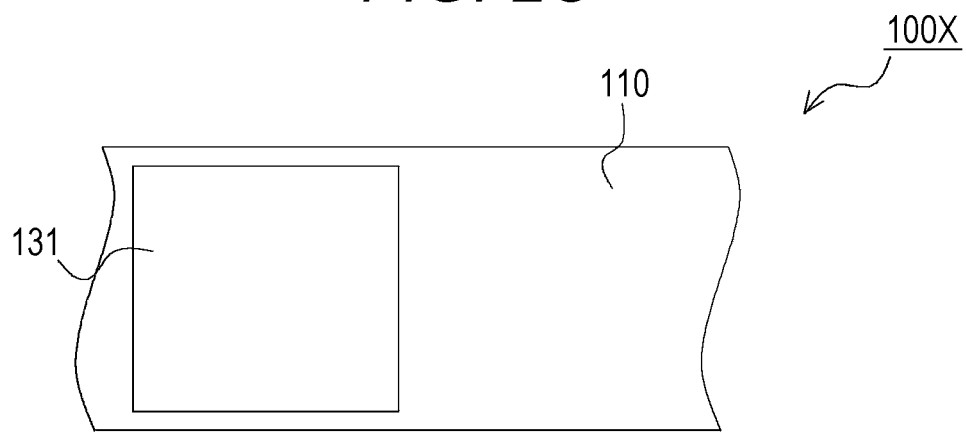

A resist pattern (a portion to be a mask) for forming the heater circuit portion 121 and the energizing portions 122 and 123, and a resist pattern for forming the heat conductive foil portion (soaking plate portion 131) are respectively formed on two surfaces of the material 100 using a technique such as photolithography. Thereafter, etching is performed. This removes unnecessary copper foil. In this way, the heater circuit portion 121, the energizing portions 122 and 123, and the soaking plate portion 131 are formed. That is, the heater circuit portion 121 and the energizing portions 122 and 123 are formed by a part of the first metal foil 120. Then, the soaking plate portion 131 is formed by a part of the second metal foil 130. The heater circuit portion 121, the energizing portions 122 and 123, and the soaking plate portion 131 are formed at substantially the same time by etching. FIGS. 2A to 2C illustrate a first intermediate product 100X after the etching step has been performed. FIG. 2A is a plan view of the first intermediate product 100X. FIG. 2B is a cross-sectional view (BB cross-sectional view in FIG. 2A) of the first intermediate product 100X. FIG. 2C is a bottom view of the first intermediate product 100X.

In this embodiment, the heater wire in the heater circuit portion 121 is provided to have a constant wire width. Further, the heater circuit portion 121 is configured so that at least one row of region (a meandering region 121X) in which the heater wire meanders to be disposed at equal intervals is provided (see FIG. 2A). Note that in this embodiment, four rows of meandering regions 121X are provided. However, needless to say, a pattern of the heater circuit portion 121 is not limited to an illustrated example. Note that a method for forming the resist pattern is not limited to photolithography, and various known techniques can be employed.

«Laminating Step»

After the etching step, the first cover film 211 covering a surface of the first metal foil 120 (corresponding to the heater circuit portion 121 and the energizing portions 122 and 123) and the second cover film 221 covering a surface of the second metal foil 130 (corresponding to the soaking plate portion 131) are provided. The first cover film 211 is attached to the base film 110 by the first adhesive layer 212 so as to sandwich the heater circuit portion 121 and the energizing portions 122 and 123. Further, the second cover film 221 is attached to the base film 110 by the second adhesive layer 222 so as to sandwich the soaking plate portion 131. The first cover film 211 and the second cover film 221 are also made of the resin material having insulating properties and flexibility, similarly to the base film 110. Note that the first cover film 211 is provided with the openings 211a and 211b as described above.

Figure 3A:
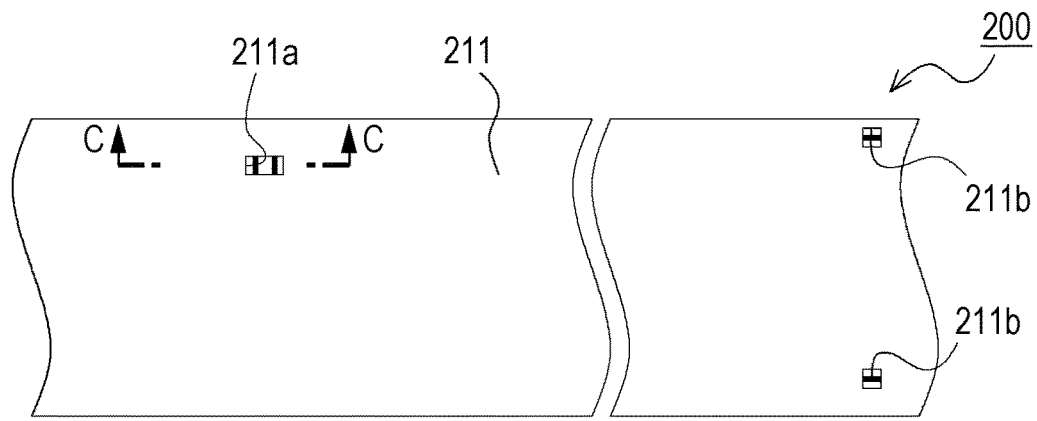
FIGS. 3A to 3C are manufacturing process diagrams of the heater having the flexible printed wiring board according to the embodiment of the present disclosure.
Figure 3B:
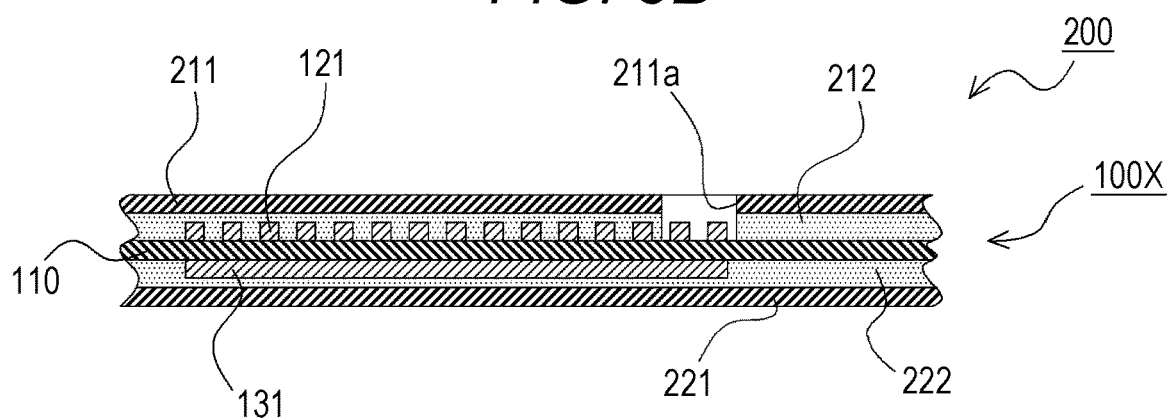
Figure 3C:
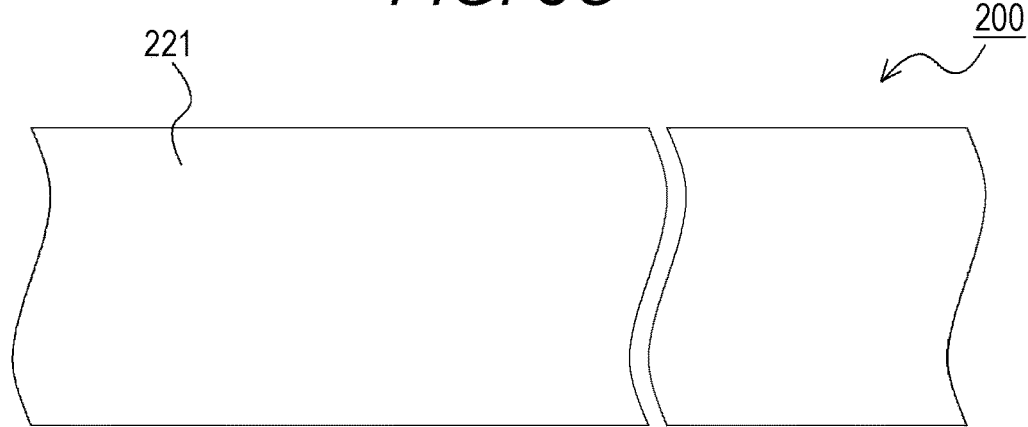

FIGS. 3A to 3C illustrate a second intermediate product 200 after the laminating step. FIG. 3A is a plan view of the second intermediate product 200, FIG. 3B is a cross-sectional view (CC cross-sectional view in FIG. 3A) of the second intermediate product 200, and FIG. 3C is a bottom view of the second intermediate product 200. Various known techniques can be employed as a laminating method for providing the first cover film 211 and the second cover film 221. Therefore, description thereof will be omitted. Note that the second intermediate product 200 corresponds to the flexible printed wiring board.

«Reflow Step (Attaching Step)»

Figure 4A:
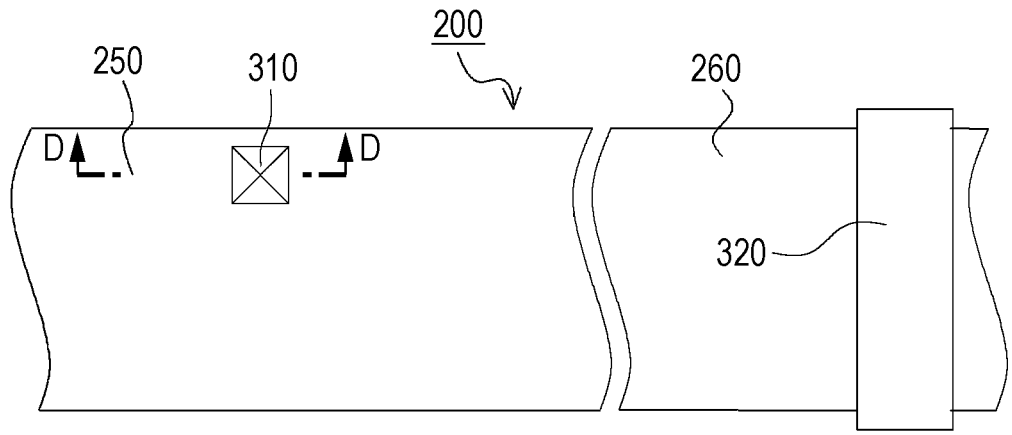
FIGS. 4A to 4C are manufacturing process diagrams of the heater having the flexible printed wiring board according to the embodiment of the present disclosure.
Figure 4B:
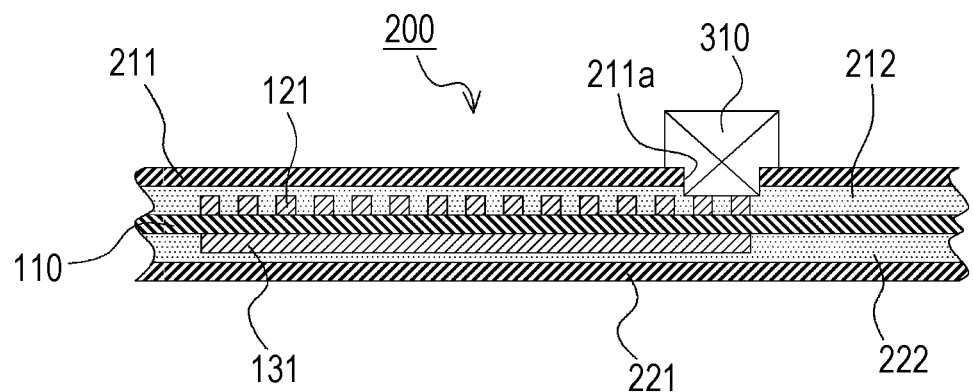
Figure 4C:
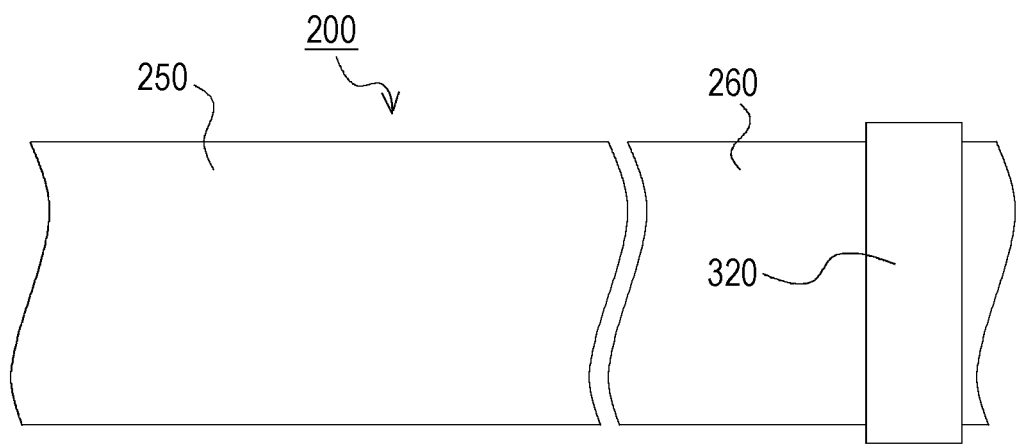

After the laminating step, the electronic component 310 and the connector 320 are attached to the flexible printed wiring board that is the second intermediate product 200. First, a portion where the first metal foil 120 (corresponding to the heater circuit portion 121 and the energizing portions 122 and 123) is exposed through the openings 211a and 211b is subjected to surface treatment such as gold plating or water-soluble preflux treatment. Thereafter, soldering is performed in a reflow furnace. Thus, various components are attached thereto. That is, in this embodiment, the electronic component 310 is connected to the heater circuit portion 121 through the opening 211a by reflow soldering. Then, the connector 320 is connected to the energizing portions 122 and 123 through the opening 211b. Therefore, attachment of the electronic component 310 and attachment of the connector 320 can be performed at substantially the same time in one step. FIG. 4A is a plan view of the intermediate product. FIG. 4B is a cross-sectional view (DD cross-sectional view in FIG. 4A) of the intermediate product. FIG. 4C is a bottom view of the intermediate product.

《Cutting Step》

After the reflow step, the intermediate product is cut so that an outer shape of the heater 10 is punched out from the second intermediate product 200. Thus, the heater 10 that is the finished product as illustrated in FIGS. 5A to 5C described above can be obtained. Note that a plurality of heaters 10 can be manufactured from one material 100.

<Advantages of Heater Having Flexible Printed Wiring Board and Method for Manufacturing the Same According to this Embodiment>

According to the heater 10 having the flexible printed wiring board and the method for manufacturing the same according to this embodiment, the soaking plate portion 131 as the heat conductive foil portion is formed by the second metal foil 130. Therefore, the separate step of attaching the member for heat conduction such as the soaking plate is not necessary. That is, the heater circuit portion 121 and the soaking plate portion 131 can be formed at substantially the same time by the etching step. As a result, the number of manufacturing steps can be reduced. Further, only the base film 110 is interposed between the heater circuit portion 121 and the soaking plate portion 131. Therefore, the thermal conductivity from the heater circuit portion 121 to the soaking plate portion 131 can be increased. Further, the soaking plate portion 131 is formed of the second metal foil 130 that is previously attached to the base film 110 as an element of the material 100. Therefore, there is little possibility that the soaking plate portion 131 is peeled off from the base film 110.

The energizing portions 122 and 123 for energizing the heater circuit portion 121 are formed of the first metal foil 120. That is, the heater circuit portion 121 and the energizing portions 122 and 123 are formed at substantially the same time by the etching step. Therefore, the step of attaching the wire harness as in a conventional case is not necessary. Therefore, the number of components can be reduced and the number of manufacturing steps can be reduced.

Further, in this embodiment, the electronic component 310 and the connector 320 can be attached in the reflow step. Therefore, the number of manufacturing steps can be further reduced. In the heater 10 according to this embodiment, the flexible printed wiring board is not provided with a through-hole. Thus, a step of providing the through-hole is not necessary. Not only that, in general, when through-hole plating is formed, a film thickness of a conductor portion tends to vary. As a result, there is a concern about effects on uniformity of temperature distribution. However, in this embodiment, there is not such a concern because of not providing the through-hole.

(Others)

Figure 6A:
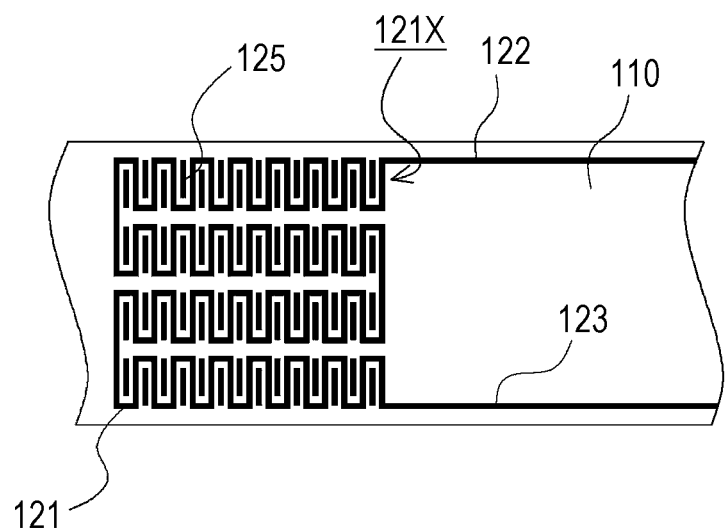
FIGS. 6A and 6B are plan views illustrating a modification of a heater circuit portion.
Figure 6B:
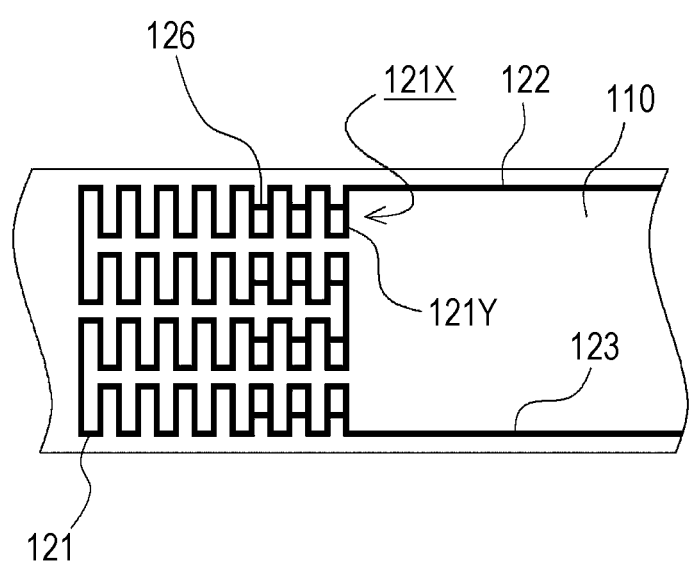
Figure 7A:
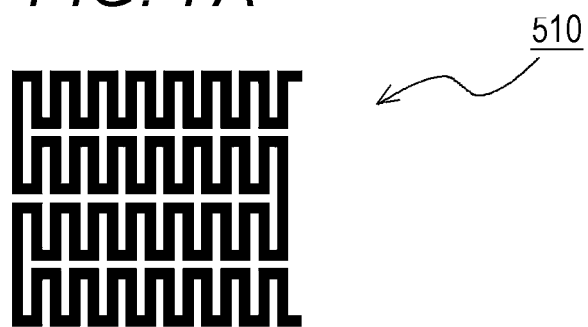
FIGS. 7A to 7C are manufacturing process diagrams of a general film-like heater.
Figure 7B:
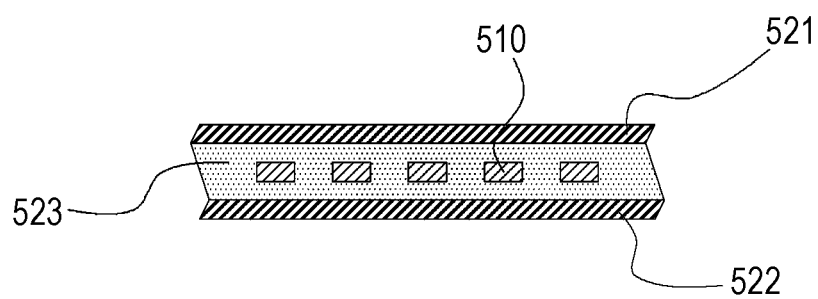
Figure 7C:
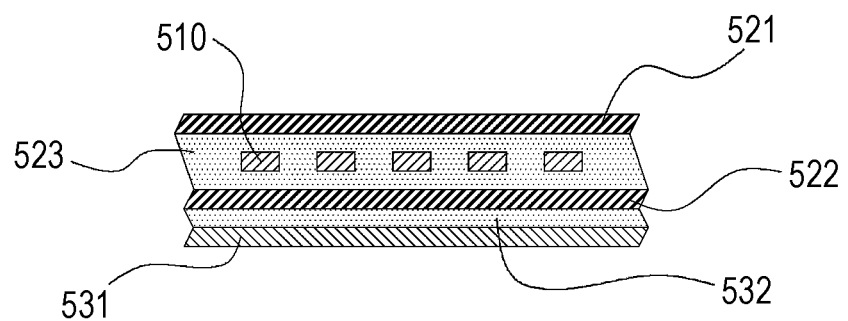
Figure 8A:
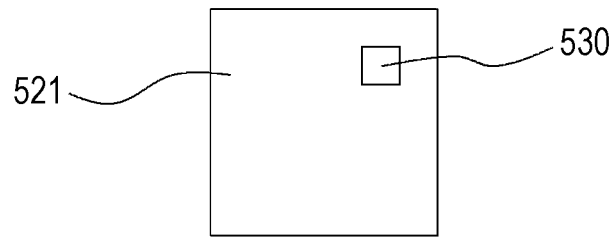
FIGS. 8A to 8C are manufacturing process diagrams of the general film-like heater.
Figure 8B:
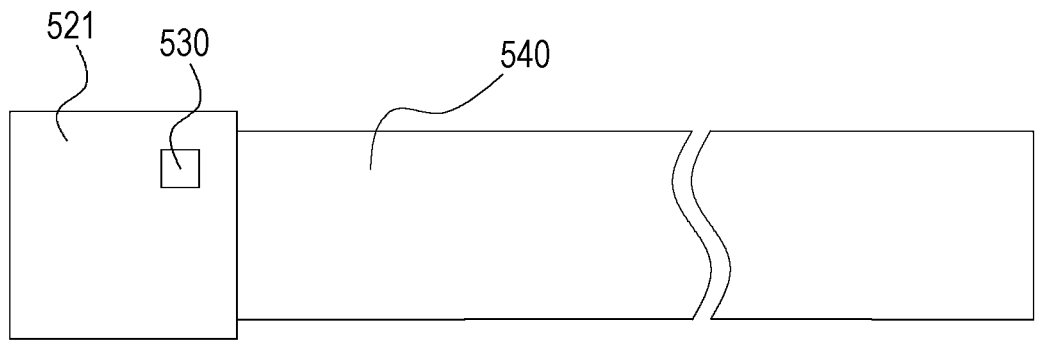
Figure 8C:
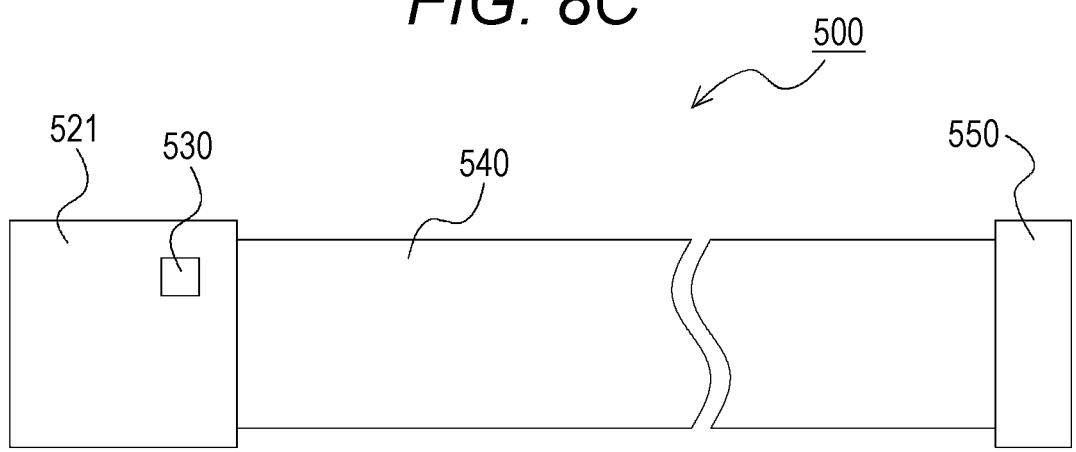

The pattern of the heater circuit portion 121 is not limited to an example illustrated in FIG. 2A described above. Various patterns can be employed. An example of the pattern will be described with reference to FIGS. 6A and 6B. FIGS. 6A and 6B illustrate the first intermediate product (the product after the etching step) for convenience of explanation.

For example, as illustrated in FIG. 6A, a configuration is employed in which a plurality of heat conductive foil portions 125 capable of maintaining the non-energized state is provided on a surface side of the base film 110 where the heater circuit portion 121 is provided. If such a configuration is employed, the temperature distribution in the heating portion 250 can be made further uniform. Further, even with the same amount of energization, heating temperature can be raised as compared with a pattern illustrated in FIG. 2A.

As illustrated in FIG. 6B, it is also possible to employ a configuration in which connecting portions 126 for short-circuiting adjacent heater wires are provided at a plurality of locations in the meandering region 121X of the heater circuit portion 121. Thus, the heater circuit portion 121 is provided with a portion having a high heat generation amount due to energization and a portion having a low heat generation amount due to energization, that is, a heat conductive foil portion 121Y exhibiting a low heat transfer function. Note that in the heat conductive foil portion 121Y, although a slight current flows, almost no heat is generated by energization. Further, a portion excluding a plurality of the heat conductive foil portions 121Y from the heater circuit portion 121 corresponds to the above-mentioned heat generating portion. If such a configuration is employed, it is possible to uniformly lower the heating temperature in a vicinity where the heat conductive foil portions 121Y are provided as compared with other regions. Therefore, when a required heating temperature varies from place to place depending on a usage environment, this configuration can be preferably employed.

In the above embodiment, an example has been shown in which the heat conductive foil portion includes the soaking plate portion 131 in order to make an overall temperature of the heating portion 250 uniform. However, depending on the application of the heater, it may be desired to uniformly raise the temperature only for a part of the heating portion and set a lower temperature for the other portions. Therefore, it is also possible to employ a configuration in which the heat conductive foil portion is provided only in a part of the heating portion 250 (the region in which the heater circuit portion 121 is provided). For example, a configuration in which the heat conductive foil portion is provided only in a half region of the region in which the heater circuit portion 121 is provided may be employed. Alternatively, a configuration may be employed in which the heat conductive foil portion is provided along four sides of a rectangular region in which the heater circuit portion 121 is provided, while the heat conductive foil portion is not provided in a center of the region.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for manufacturing a heater having a flexible printed wiring board, comprising an etching step and a laminating step in this order, wherein the etching step comprises: etching a first metal foil positioned on a first surface of a base film and a second metal foil positioned on a second surface of the base film; forming a heater circuit portion that generates heat when energized, by a part of the first metal foil; and forming a heat conductive foil portion that maintains a non-energized state, by a part of the second metal foil, wherein the heater circuit portion and the heat conductive foil portion are formed at the same time, and the laminating step comprises providing a first cover film that covers a surface of the first metal foil and a second cover film that covers a surface of the second metal foil.

2. The method for manufacturing the heater having the flexible printed wiring board according to claim 1, wherein the heat conductive foil portion covers a region of the second surface corresponding to an entire region of the first surface in which the heater circuit portion is provided, the base film being interposed between the heat conductive foil portion and the heater circuit portion.

3. The method for manufacturing the heater having the flexible printed wiring board according to claim 1, wherein a part of the first metal foil forms an energizing portion that energizes the heater circuit portion in the etching step.

4. The method for manufacturing the heater having the flexible printed wiring board according to claim 3, further comprising a reflow step following the laminating step, wherein the reflow step comprises providing at least one electronic component that is disposed on a surface of the first cover film and is electrically connected to the first metal foil, and a connector that is electrically connected to the energizing portion, by reflow soldering.

5. The method for manufacturing the heater having the flexible printed wiring board according to claim 3, wherein the energizing portion, the heater circuit portion, and the heat conductive foil portion are formed at the same time.

* * * * *